United States Patent [19]

Hatano et al.

[11] Patent Number: 5,670,816

[45] Date of Patent: Sep. 23, 1997

[54] SEMICONDUCTOR DEVICE

[75] Inventors: Hiroshi Hatano, Hamamatsu; Ichiro Yoshii, Kawasaki; Satoru Takatsuka, Tokyo, all of Japan

[73] Assignee: Kabushiki Kaisha Toshiba, Kawasaki, Japan

[21] Appl. No.: 487,163

[22] Filed: Jun. 7, 1995

Related U.S. Application Data

[63] Continuation of Ser. No. 134,856, Oct. 12, 1993, abandoned, which is a continuation-in-part of Ser. No. 715,886, Jun. 18, 1991, abandoned, which is a continuation of Ser. No. 505,439, Apr. 6, 1990, abandoned.

[30] Foreign Application Priority Data

Apr. 7, 1989 [JP] Japan .............................. 1-88730

[51] Int. Cl.$^6$ .................................................. H01L 29/76
[52] U.S. Cl. .................................................. 257/394; 257/400
[58] Field of Search ............................ 357/23.11, 29; 257/394, 398, 399, 400

[56] References Cited

U.S. PATENT DOCUMENTS

| | | | |
|---|---|---|---|
| 3,868,721 | 2/1975 | Davidsohn | 357/23.11 |
| 4,506,436 | 3/1985 | Bakeman et al. | 357/23.6 |
| 4,591,890 | 5/1986 | Lund et al. | 357/23.11 |
| 4,613,886 | 9/1986 | Chwang | 357/23.11 |
| 4,748,489 | 5/1988 | Komatsu | 357/23.11 |
| 4,990,983 | 2/1991 | Custode et al. | 357/23.11 |

FOREIGN PATENT DOCUMENTS

| | | |
|---|---|---|
| 0 098 165 | 1/1984 | European Pat. Off. . |
| 0 280 368 | 8/1988 | European Pat. Off. . |
| 0 282 082 | 9/1988 | European Pat. Off. . |
| 1 789 026 | 6/1971 | Germany . |
| 62-35557 | 2/1987 | Japan . |
| 62-262462 | 11/1987 | Japan . |
| 2-267970 | 11/1990 | Japan . |

OTHER PUBLICATIONS

Hiroshi Hatano et al., "Total Dose Radiation–Hardened Latch–Up Free CMOS Structures for Radiation–Tolerant VLSI Designs", *IEEE Transactions on Nuclear Science*, vol. NS–33, No. 6, Dec. 1986, pp. 1505–1509.

"Zero Biased Junction for Reduction of Alpha–Particle–Induced FET Leakage," IBM Technical Disclosure Bulletin, vol. 23, No. 2, dated Jul. 1980.

Patent Abstracts of Japan, vol. 5, No. 167 (839) dated Oct. 24, 1981.

National Convention Record of the Institute of Electronics, Information and Communication Engineers, pp. 4–490, Radiation–Hardened Digital LSI's by H. Hatano, dated Mar. 1989.

*Primary Examiner*—Mark V. Prenty
*Attorney, Agent, or Firm*—Finnegan, Henderson, Farabow, Garrett & Dunner, L.L.P.

[57] ABSTRACT

In a semiconductor device having at least two conductive layers disposed close to each other on an element isolating insulation film formed on a first P-type region, a second P-type region is formed in a region of the first P-type region which is between the two conductive layers. The impurity concentration of the second P-type diffusion region is higher than the first P-type region. A region of the element isolating insulation film which is on the second P-type diffusion region is thin to form a thin insulation film. With the features, no inversion layer is formed in the region of the first P-type region where the second P-type diffusion region is formed. As a result, the inversion layers under the conductive layers will not be in contact with each other.

2 Claims, 6 Drawing Sheets

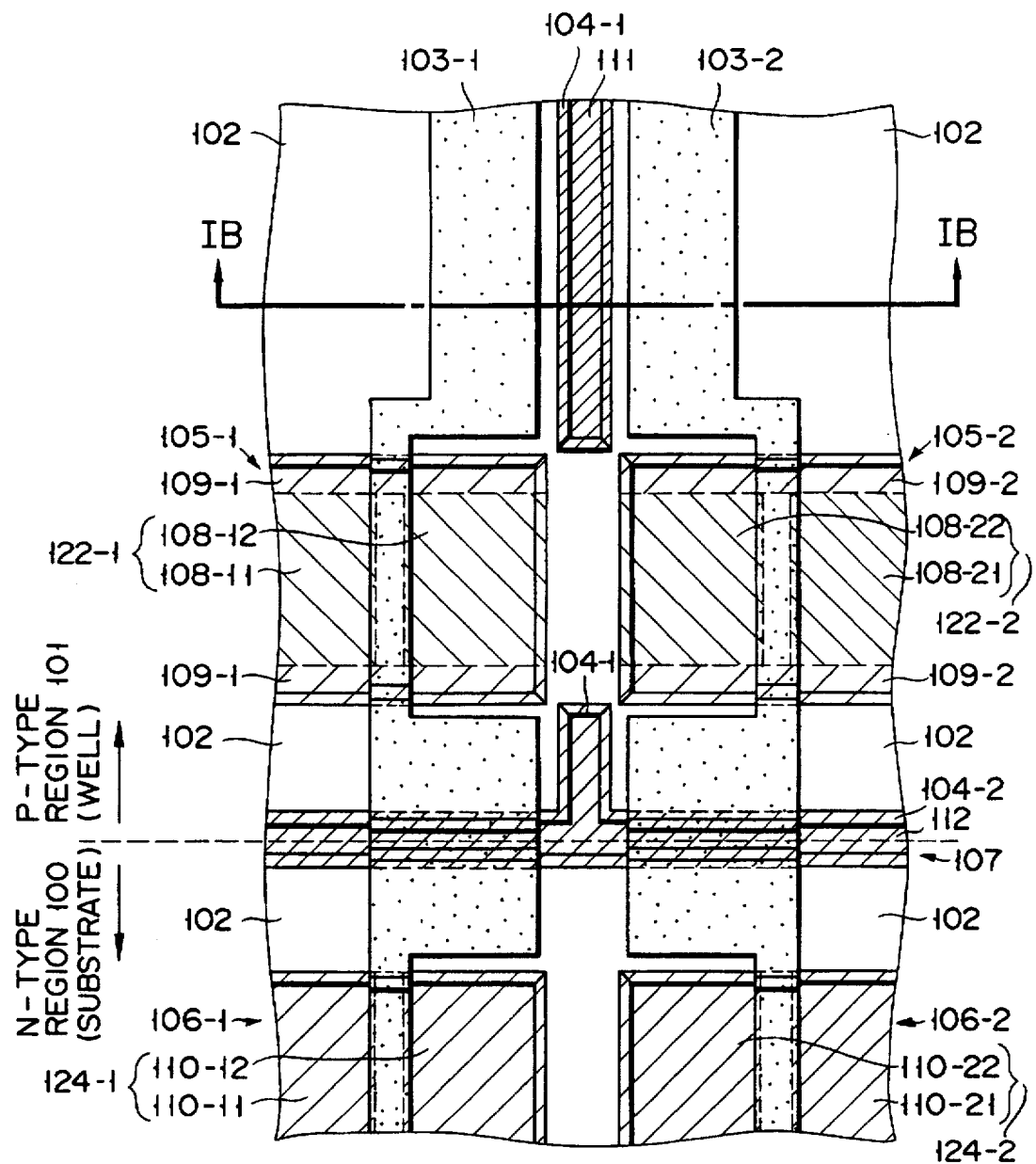
F I G. 1A

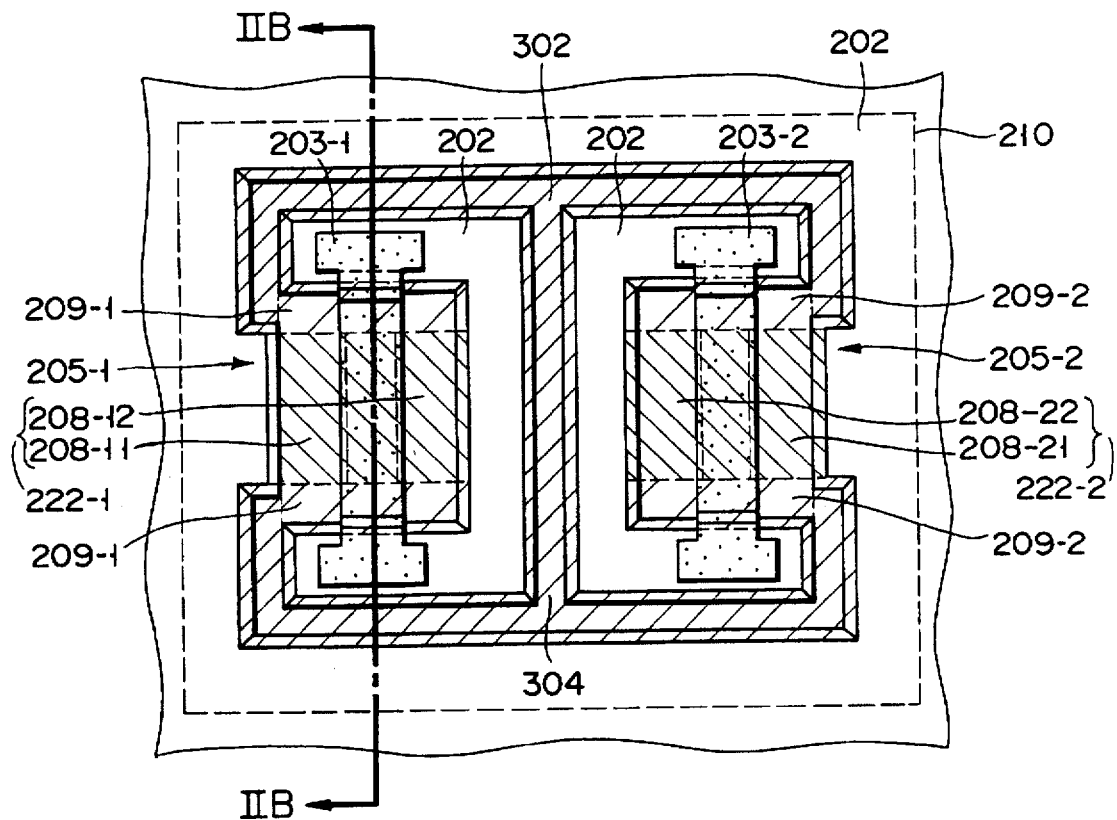
F I G. 2A
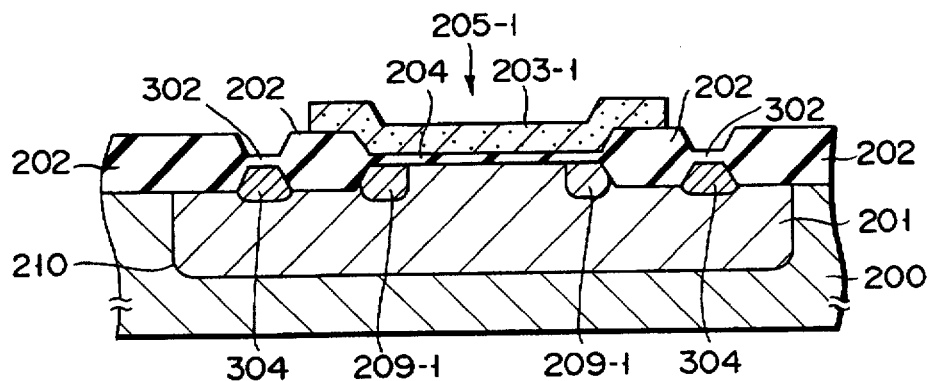
F I G. 2B

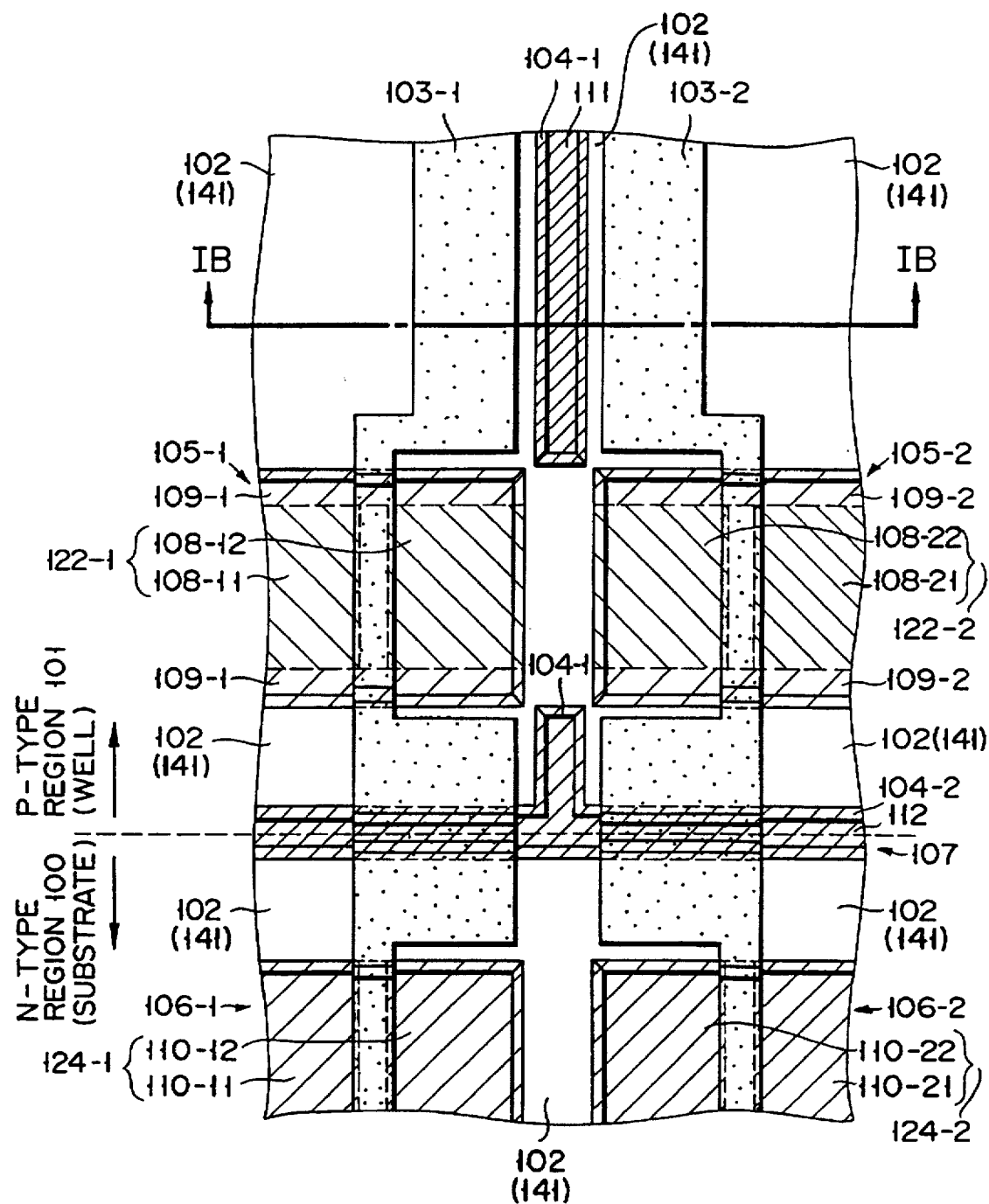
F I G. 3A

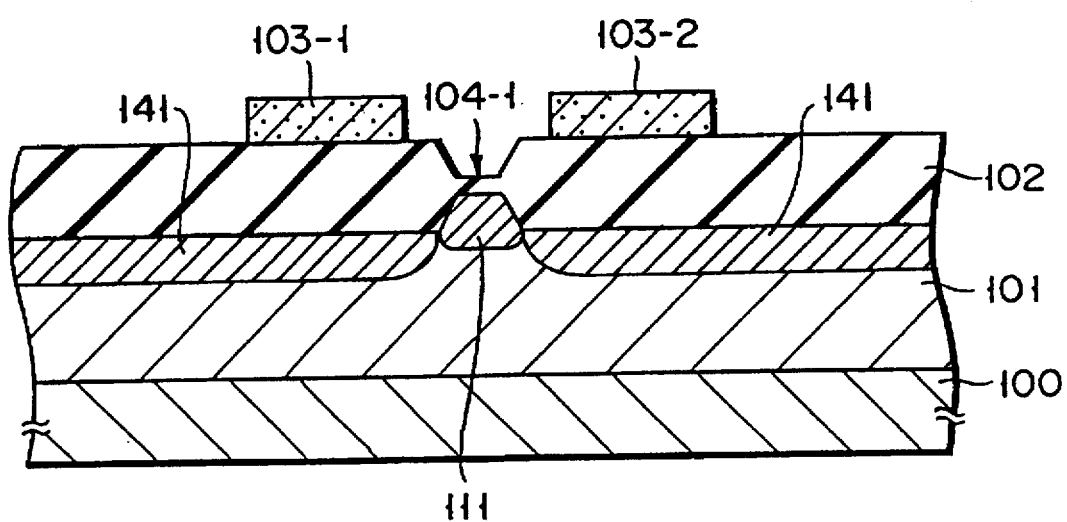
F I G. 3B

SEMICONDUCTOR DEVICE

This application is a continuation of application Ser. No. 08/134,856, filed Oct. 12, 1993, now abandoned, which is a continuation-in-part application Ser. No. 07/715,886, filed Jun. 18, 1991, now abandoned, which is a continuation of application Ser. No. 07/505,439, filed Apr. 6, 1990, now abandoned.

BACKGROUND OF THE INVENTION

1. Field of the Invention

The present invention relates to a semiconductor device, and more particularly to a semiconductor device used in a place where much radiation is present, for example, in space or in a nuclear plant.

2. Description of the Related Art

Generally, a semiconductor device is provided with a field oxide film for electrically isolating adjacent elements from one another. The field oxide film is very thick.

When the field oxide film is radiated with radiation such as gamma rays, electron-hole pairs are generated in the oxide film. The thicker the oxide film is, the larger the number of electron-hole pairs is. Accordingly, when a semiconductor device is radiated with radiation such as gamma rays, a great number of electron-hole pairs are generated in the thick field oxide film. Various types of potential wirings are layered over the field oxide film. For example, a gate electrode runs across a plurality of element regions of the device. Consider a case where the gate electrode is set at a high potential. Of the electron-hole pairs generated in the field oxide film that underlies the gate electrode, the electrons are attracted by the potential of the gate electrode. Electrons have high mobility in the oxide film. Accordingly, the electrons pass through field oxide film, through the gate electrode. Since the mobility of holes is low in the oxide film, the holes are repulsed by the potential of the gate, and captured and accumulated in the field oxide film, particularly a region in the vicinity of the interface between the field oxide film and the silicon substrate. Therefore, in the case where the the semiconductor substrate underlying the field oxide film is a P-type diffusion region, the conductivity type in the surface region of the P-type diffusion region is inverted to the N-type by the accumulated holes. Accordingly, where N-channel MOS transistors are formed in the element regions isolated by the field oxide film, a leak current flows through these transistors via the inverted N-type layer. The leak current possibly causes malfunction of the semiconductor device and increases the power dissipation.

In the semiconductor device of the type in which the adjacent gate electrodes are relatively closely located on the field oxide film, such as a gate array semiconductor device, when such inversion layers are formed under the adjacent gate electrodes, the inversion layers are in contact with each other, and a leak current flows between the gate electrodes.

SUMMARY OF THE INVENTION

Accordingly, an object of the present invention is to provide a semiconductor device which is free from the leak current due to radiation, and is normally operable in place where much radiation exists.

According to the present invention, there is provided a semiconductor device having at least two conductive layers disposed close to each other on an element isolating insulation film, comprising:

a first P-type region;

an element isolating insulation film formed on the first P-type region;

at least two conductive layers disposed close to each other on the element isolating film; and a second P-type diffusion region whose impurity concentration is higher than the first P-type region, the second P-type region being formed in a region of the first P-type region which is between the two conductive layers, wherein a region of the element isolating insulation film, which is on the second P-type diffusion region, is thin to form a thin insulation film.

In the semiconductor device thus arranged, the second P-type diffusion region whose impurity concentration is higher than that of the first P-type diffusion region is provided in the region of the first P-type region, which is located between the conductive layers disposed close to each other on the element isolating insulation film. Furthermore, the region of the insulation film which is on the second P-type diffusion region is thinned. With the features, no inversion layer is formed in the region of the first P-type region where the second P-type diffusion region is formed. As a result, the inversion layers under the conductive layers will not be in contact with each other.

BRIEF DESCRIPTION OF THE DRAWINGS

FIG. 1A is a plan view showing a semiconductor device according to a first embodiment of the present invention;

FIG. 2A is a plan view showing a semiconductor device according to a second embodiment of the present invention;

FIG. 2B is a cross sectional view taken on line IIB—IIB of FIG. 2A;

FIG. 3A is a plan view showing a semiconductor device according to a third embodiment of the present invention;

FIG. 3B is a cross sectional view taken on line IB—IB of FIG. 3A;

DETAILED DESCRIPTION OF PREFERRED EMBODIMENTS

Preferred embodiments of the present invention will be described with reference to the accompanying drawings.

A first embodiment of the present invention will be described with reference to FIGS. 1A and 1B.

Figure 1B:
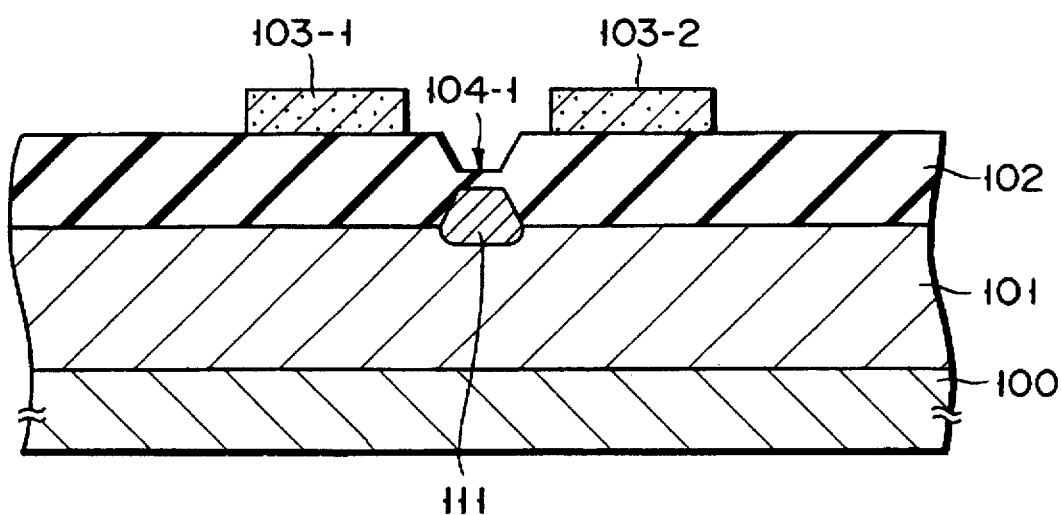
FIG. 1B is a cross sectional view taken on line IB—IB of FIG. 1A.

FIG. 1A is a plan view showing a semiconductor device according to a first embodiment of the present invention. FIG. 1B is a cross sectional view taken on line IB—IB of FIG. 1A.

The first embodiment is a CMOS gate array incorporating the present invention.

As shown in FIG. 1A or 1B, a P-well region 101 is in an N-type semiconductor substrate 100. Thick field oxide films 102 as insulating films for element isolation are selectively formed in the surface region of the N-type semiconductor substrate 100. Regions as defined by the field oxide films 102 serve as active element regions. In this instance, four active element regions 105-1, 105-2, 106-1, and 106-2 are exemplarily illustrated, although a number of active element regions are formed in an actual semiconductor device. N-channel MOS transistors 122-1 and 122-2 are in the active element regions 105-1 and 105-2 in the P-well region 101. In the transistor 122-1, a region 108-11 serves as a source region, and a region 108-12, as a drain region. In the transistor 122-2, the region 108-21 serves as a source region, and the region 108-22, as a drain region. P-type layers 109-1 for preventing the inversion of the conductivity type, whose impurity concentration is higher than that of the P-well region, are on both sides of each N-type region 108-11 and 108-12 as viewed in the direction of the gate length of the transistor 122-1. Similarly, P-type layers 109-2 for preventing the inversion, whose impurity concentration is higher than that of the P-well region, are on both sides of each N-type region 108-21 and 108-22 as viewed in the direction of the gate length of the transistor 122-2. An oxide film (not shown), which is thinner than the field oxide film 102, is on the P-type layers 109-1 and 109-2, that is, on the end regions of the gates of the N-channel MOS transistors 122-1 and 122-2.

P-channel MOS transistors 124-1 and 124-2 are in the active element regions 106-1 and 106-2 in the N-type semiconductor substrate 100. In the transistor 124-1, P-type diffusion regions 110-11 and 110-12 serve as a source region and a drain region. In the transistor 124-2, the P-type diffusion regions 110-21 and 110-22 serve as a source region and a drain region. A gate electrode 103-1 is on the active element regions 105-1 and 106-1 and the field oxide film 102. A gate electrode 103-2 is on the active element regions 105-2 and 106-2 and the field oxide film 102. These gate electrodes 103-1 and 103-2 are disposed close to each other on the field oxide film 102 within the P-well region 101. A region of the field oxide film 102 which is between the gate electrodes 103-1 and 103-2 is thin. This thin position is denoted by 104-1. Another region of the field oxide film 102 which is on a boundary region 107 between the P-well region 101 and the N-type semiconductor substrate 100 is also thin. This thin portion is denoted by 104-2. A P-type guard band layer 111 whose impurity concentration is higher than that of the P-type inversion prevention layer 109 is on a region of the P-well region 101 which is under the thin oxide film 104-1. A P-type guard band layer 112 whose impurity concentration is higher than that of the P-type inversion prevention layer 109 is on the regions of the P-well region 101 and the N-type semiconductor substrate 100 which are under the thin oxide film 104-2.

According to the first embodiment, in the semiconductor device of the type in which adjacent gate electrodes 103-1 and 103-2 are disposed close to each other on the field oxide film 102, the region 104-1 of the element isolating film 102 located between the adjacent gate electrodes is thinner than the remaining portion. Further, the P-type guard band layer 111 of higher impurity concentration than that of the P-well region 101 is formed under the thin oxide film 104-1. Since the oxide film 104-1 is thin, if it is exposed to radiation such as gamma rays and electron-hole pairs are generated therein, the number of the pairs is small. For this reason, the inversion layer is hard to form in the P-type guard band layer 111. When the instant semiconductor device is exposed to gamma rays, for example, even if the gate electrodes 103-1 and 103-2 are set at high potential, and inversion layers are formed in the regions of the P-well region 101 which are under those electrodes, the formed inversion layers terminate at the guard band layer 111. Therefore, the inversion layers generated under the adjacent gate electrodes do not connect to each other. Accordingly, little leak current flows between the adjacent active elements, ensuring stable and reliable operation of the semiconductor device.

Further, it is noted that in the semiconductor device according to the first preferred embodiment, the thin oxide film 104-2 is on the boundary region 107 of the P-well region 101 and the N-type semiconductor substrate 100, and the P-type guard band layer 112 is formed under the thin oxide film 104-2. With this feature, no inversion layer is formed in the boundary region 107. Therefore, a leak current is prevented from generating between the N-type substrate 100, i.e., N-type region, and each of the N-channel MOS PETs 122-1 and 122-2. The fact that the oxide film 104-2 on the guard band layer 112 is thin implies that a less number of electron-hole pairs are formed when this film is subjected to gamma rays. Therefore, this is very effective to prevent the leak current generation, which is due to the radiation. In the present embodiment, the regions of the oxide film (not shown) on the P-type layers 109-1 and 109-2 are thin. Accordingly, the inversion preventing P-type layers 109-1 and 109-2 prevents from occurring a leak current between the source region 108-11 and the drain region 108-12, and a leak current between the source region 108-21 and the drain region 108-22.

To form the thin oxide films 104-1 and 104-2, in a mask forming step preceding to a step for selectively oxidizing the surface region of the substrate to form the field oxide film 102, a nitride film as an acid-proof film used as a mask is patterned such that a portion of the nitride film which is on a region of the substrate where the thin oxide film is to be formed is left. To be more specific, to form the field oxide film 102, a nitride film as an acid-proof film is formed over the substrate, and a photo resist film is formed over the nitride film. The photo resist film is patterned to form a predetermined pattern of a photo resist film. By using the photo resist film as a mask, a field oxide film is formed on the regions of the surface region of the substrate which are not covered by the photo resist film. To form the thin oxide films 104-1 and 104-2, the patterning of the photo resist film is first made such that the nitride film remains on a region of the substrate where the thin oxide film is to be formed, and then when the nitride film is selectively etched, the portion of the nitride film on the region of the substrate where the thin oxide film is to be formed. Accordingly, when the surface region of the substrate is selectively oxidized, no thermal oxide film is formed under the remaining oxide film, and only the thin oxide films 104-1 and 104-2, which are naturally oxidized, exist thereunder.

The P-type guard band layers 111 and 112 can be formed in a high concentration ion implanting step for forming the P-type source regions 110-11 and 110-21 and the P-type drain regions 110-12 and 110-22 of the P-channel MOS transistors 124-1 and 124-2. If these layers are formed in that step, the number of the steps required for manufacturing the semiconductor device will not be increased.

To form the thin oxide films (not shown) at the end regions of the gates of the N-channel MOS transistors which are on the inversion preventing layers 109-1 and 109-2, an oxide film (not shown) formed on the active element regions 105-1 and 105-2, which is later patterned to form the gate oxide films, can be used. Alternatively, another oxide films thinner than the field oxide film 102 can be used.

The thin oxide films 104-1 and 104-2 can be formed by selectively etching the thick field oxide film 102. In this case, the guard band layers 111 and 112 are formed before the formation of the field oxide film 102.

A second embodiment of the invention will be described with reference to FIGS. 2A and 2B.

FIG. 2A is a plan view showing a semiconductor device according to a second embodiment of the present invention. FIG. 2B is a cross sectional view taken on line IIB—IIB of FIG. 2A.

As shown in FIG. 2A or 2B, a P-well region 201 is in an N-type semiconductor substrate 200. Field oxide films 202 as insulating films for element isolation are selectively patterned in the surface region of the N-type semiconductor substrate 200 including the P-well region 201. Regions as defined by the field oxide films 202 serve as active element regions. In this instance, two active element regions 205-1 and 205-2 are exemplarily illustrated, although a number of active element regions are formed in an actual semiconductor device. An N-channel MOS transistor 222-1 having an N-type source region 208-11 and a drain region 208-12, and an N-channel MOS transistor 222-2 having an N-type source region 208-21 and and a drain region 208-22 are in the active element regions 205-1 and 205-2 in the P-well region 101, respectively. P-type layers 209-1 for preventing the inversion, whose impurity concentration is higher than that of the P-well region 201, are on both sides of each N-type region 208-11 and 208-12 as viewed in the direction of the gate length of the transistor 222-1. Similarly, P-type layers 209-2 for preventing the inversion, whose impurity concentration is higher than that of the P-well region 201, are on both sides of each N-type region 208-21 and 208-22 as viewed in the direction of the gate length of the transistor 222-2. As shown in FIG. 2B, those regions of the field oxide film 202 which are on the inversion preventing layers 209-1 and 209-2 are thinned as in the first embodiment. The oxide film at the edge regions of the gates of the N-channel MOS transistors 222-1 and 222-2 is thinned (FIG. 2B), for example, to be approximately equal to the thickness of a thin gate oxide film 204. The gate oxide film 204 is formed over the active element regions 205-1 and 205-2. In the drawing, the gate oxide film on the element region 205-2 is not illustrated. Gate electrode 203-1 and 203-2 of the MOS transistors 222-1 and 222-2 are over the active element regions 205-1 and 205-2 and the field oxide film 202. The fringe portion of the gate electrodes which are 203-1 and 203-2, that is, those portions of the gate electrodes which are located off the channels and on the field oxide film 202, as viewed from above are substantially surrounded by the thin oxide film 302 and the thin oxide film at the gate end regions of the N-channel MOS transistors. Under the oxide film 302 is a P-type guard band layer 304 whose impurity concentration is higher than that of the inversion preventing P-type layers 209-1 and 209-2. Under the thin oxide films at the gate end regions of the N-channel MOS transistors 222-1 and 222-2 are the inversion preventing P-type layers 209-1 and 209-2. In the figure, reference numeral 210 designates an interface between the substrate 200 and the P-well region 201.

In the second embodiment thus structured, the thin oxide film 302 is formed on the P-type guard band layer 304. Therefore, the conductivity type of the P-type guard band 304 will not be inverted even when the semiconductor device is subjected to radiation and the potential of the gate electrodes 203-1 and 203-2 increase. Accordingly, little current leak occurs between the adjacent active elements. The fringes of the gate electrodes 203-1 and 203-2, as viewed from above, are substantially surrounded by the guard band layer 304 under the thin oxide film 302, and the inversion preventing P-type layers 209-1 and 209-2 under the thin oxide film at the gate end region. Therefore, if an inversion layer is formed in the region of the P-well region 201 which is under the fringe of the gate electrode 203-1, little leak current will be generated that flows through the inversion layer between the N-type source region 208-1 and the drain region 208-2. Similarly, if an inversion layer is formed in the region of the P-well region 201 which is under the fringe of the gate electrode 203-2, little leak current will be induced that flows through the inversion layer between the N-type source region 208-1 and the drain region 208-2. The process required to form the thin oxide films may be substantially the same as that used in the first embodiment. In a mask forming step preceding to a step for selectively oxidizing the surface region of the substrate 200 to form the field oxide film 202, a nitride film as an acid-proof film used as a mask is patterned such that a portion of the nitride film which is on a region of the substrate where the thin oxide film is to be formed is left. The inversion preventing P-type layers 209-1 and 209-2 and the P-type guard band layer 304 may be formed in a high concentration ion implanting step for forming the P-type source regions and the drain regions of the P-channel MOS transistors (not shown) formed in the N-type substrate 200. If these layers are formed in that step, the number of the steps required to manufacture the semiconductor device will not be increased. To form the thin oxide films at the gate end regions of the N-channel MOS transistors which are on the inversion preventing layers 209-1 and 209-2 (the gate oxide film on the element region 205-2 is not shown), an oxide film (not shown) from on the active element regions 205-1 and 205-2, which is later patterned to form the gate oxide films, may be used. Alternatively, another oxide films thinner than the field oxide film 202 may be used.

FIG. 3A is a plan view showing a semiconductor device according to a third embodiment of the present invention. FIG. 3B is a cross sectional view taken on line IB—IB of FIG. 3A. Elements in the third embodiment of the invention that correspond to elements in the first embodiment of the invention are labelled with corresponding reference numbers.

In the third embodiment of the invention, under the thick portion of the field oxide film 102 over P-well region 101, a P-type region 141 as a channel stopper is formed. In FIG. 3B, a portion of P-type region 141 is shown, which is formed on P-well region 101, in an area between the P-type guard band layer 111 and the well-substrate junction. P-type region 141 has an impurity concentration higher than that of P-well region 101, but lower than that of the guard band layer 111. P-type regions 111 and 141 can be formed by a known manufacturing method using, for example, an ion-implantation and heating process. However, those regions 111 and 141 are formed by different steps.

Figure 4A:
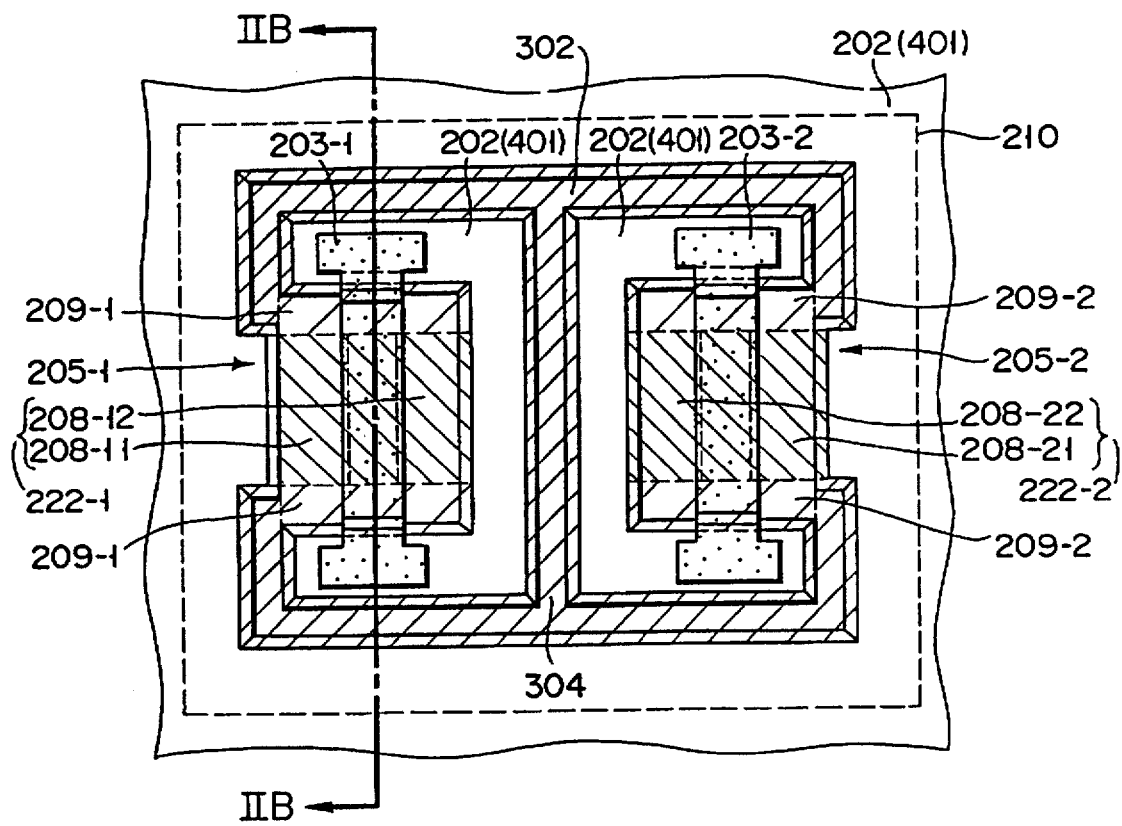
FIG. 4A is a plan view showing a semiconductor device according to a fourth embodiment of the present invention.
Figure 4B:
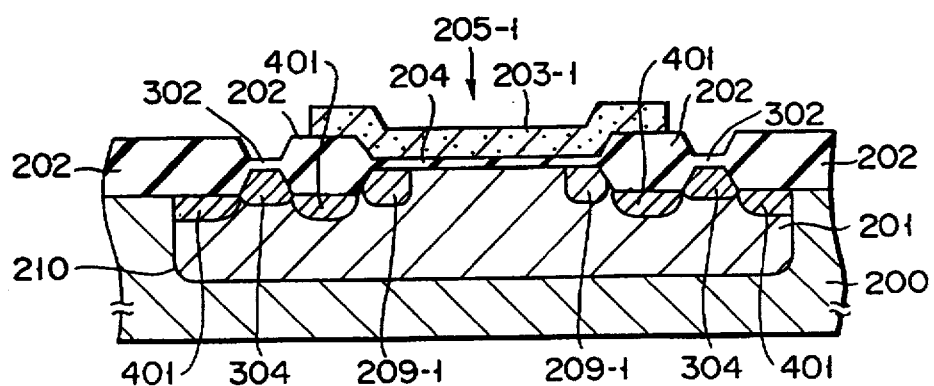
FIG. 4B is a cross sectional view taken on line IIB—IIB of FIG. 4A.

FIG. 4A is a plan view showing a semiconductor device according to a fourth embodiment of the present invention. FIG. 4B is a cross sectional view taken on line IIB—IIB of FIG. 4A. Elements in the fourth embodiment of the invention that correspond to elements in the second embodiment of the invention are labelled with corresponding reference numbers.

In the fourth embodiment of the invention, under the thick portion of the field oxide film 202 over P-well region 201, a P-type region 401 as a channel stopper is formed. Specifically, in FIG. 4B, a portion of P-type region 401 is shown, which is formed on P-well region 201, in an area between the P-type region 304 and the P-type region 209-1, and in an area between the P-type region 304 and the well-substrate junction. P-type region 401 has an impurity concentration higher than that of P-well region 201, but lower than that of P-type layer 304. P-type regions 209-1, 304 and 401 can be formed by a known manufacturing method using, for example, an ion-implantation and heating process. However, those regions 209-1, 304 and 401 are formed by different steps.

As described above, according to the preferred embodiments of the present invention, there is provided a reliable semiconductor device which is relatively free from the leak current due to radiation, and is normally operable in place where much radiation exists.

What is claimed is:

1. A semiconductor device comprising:

a first P-type region having a first impurity concentration;

an N-channel MOS transistor, in the first P-type region, including
   a source,
   a channel juxtaposed to the source, and
   a drain juxtaposed to the channel;

a second P-type region on the first P-type region, and having an impurity concentration higher than the first impurity concentration;

a third P-type region on the first P-type region, and having a side adjacent to the channel and extending from the source to the drain, the third P-type region having a third impurity concentration higher than the first impurity concentration;

a fourth P-type region on the first P-type region, in an area between the second P-type region and the third P-type region, and having an impurity concentration lower than the third impurity concentration and higher than the first impurity concentration; and an insulation film having a first thickness in an area on the fourth P-type region, having a second thickness in an area on the second P-type region, the second thickness being smaller than the first thickness, and having a third thickness in an area on the third P-type region, the third thickness being smaller than the first thickness.

2. The semiconductor device according to claim 1, further including an N-type semiconductor substrate including a P-channel MOS transistor, arranged with the N-channel MOS transistor in a complementary MOS configuration, the first P-type region being a P-well region in the N-type semiconductor substrate; and a fifth P-type diffusion region, in an interface region between the N-type substrate and the P-well region, the fifth P-type diffusion region having an impurity concentration higher than the first impurity concentration.

* * * * *